United States Patent [19]
Cleereman et al.

[11] Patent Number: 5,960,184
[45] Date of Patent: Sep. 28, 1999

[54] METHOD AND APPARATUS FOR PROVIDING OPTIMIZATION PARAMETERS TO A LOGIC OPTIMIZER TOOL

[75] Inventors: Kevin C. Cleereman, Moundsview; Kenneth E. Merryman, Fridley, both of Minn.

[73] Assignee: Unisys Corporation, Blue Bell, Pa.

[21] Appl. No.: 08/752,619

[22] Filed: Nov. 19, 1996

[51] Int. Cl.⁶ ................................. G06F 15/60
[52] U.S. Cl. ................. 395/500.04; 395/500.35
[58] Field of Search .................... 364/488, 489, 364/490, 491, 578

[56] References Cited

U.S. PATENT DOCUMENTS

| | | | |
|---|---|---|---|
| 4,758,953 | 7/1988 | Morita et al. | 364/300 |
| 4,831,543 | 5/1989 | Mastellone | 364/489 |
| 4,918,614 | 4/1990 | Modarres et al. | 364/490 |
| 5,031,111 | 7/1991 | Chao et al. | 364/491 |
| 5,050,091 | 9/1991 | Rubin | 364/488 |
| 5,164,908 | 11/1992 | Igarashi | 364/491 |
| 5,175,696 | 12/1992 | Hooper et al. | 364/489 |
| 5,222,029 | 6/1993 | Hooper et al. | 364/489 |
| 5,255,363 | 10/1993 | Seyler | 395/164 |
| 5,267,175 | 11/1993 | Hooper | 364/489 |
| 5,341,309 | 8/1994 | Kawata | 364/489 |
| 5,349,659 | 9/1994 | Do et al. | 395/700 |
| 5,355,317 | 10/1994 | Talbott et al. | 384/468 |
| 5,357,440 | 10/1994 | Talbott et al. | 364/467 |
| 5,359,523 | 10/1994 | Talbott et al. | 364/468 |
| 5,359,537 | 10/1994 | Saucier et al. | 364/489 |
| 5,361,357 | 11/1994 | Kionka | 395/700 |
| 5,398,195 | 3/1995 | Kim | 364/491 |
| 5,406,497 | 4/1995 | Altheimer et al. | 364/489 |
| 5,416,721 | 5/1995 | Nishiyama et al. | 364/491 |
| 5,418,733 | 5/1995 | Kamijima | 364/490 |
| 5,418,954 | 5/1995 | Petrus | 395/700 |
| 5,440,720 | 8/1995 | Baisuck et al. | 395/500 |
| 5,459,673 | 10/1995 | Carmean et al. | 364/489 |
| 5,483,461 | 1/1996 | Lee et al. | 364/490 |
| 5,485,396 | 1/1996 | Brasen et al. | 364/491 |
| 5,490,266 | 2/1996 | Sturges | 395/500 |
| 5,490,268 | 2/1996 | Matsunaga | 395/550 |
| 5,491,640 | 2/1996 | Sharma et al. | 364/488 |
| 5,493,508 | 2/1996 | Dangelo et al. | 364/489 |
| 5,499,192 | 3/1996 | Knapp et al. | 364/489 |
| 5,603,043 | 2/1997 | Taylor et al. | 395/800 |

*Primary Examiner*—Kevin J. Teska
*Assistant Examiner*—Thuan Do
*Attorney, Agent, or Firm*—Charles A. Johnson; Mark T. Starr; Nawrocki, Rooney & Sivertson, P.A.

[57] ABSTRACT

A method and apparatus for providing optimization parameters to an EDA logic optimizing tool. The optimization parameters for selected circuit modules within a circuit design database may be stored such that a particular optimization parameter set can be uniquely identified by a search capability of a data processing system, thereby enabling the logic optimizer tool to select and access a particular optimization parameter set from a collection of optimization parameter sets. Further, the optimization parameters may be stored such that the corresponding optimization parameters can be collectively viewed by a circuit designer.

28 Claims, 15 Drawing Sheets

ILLUSTRATIVE OPTIMIZATION CONTROL SPREADSHEET

| MODULE NAME | OPTIMIZATION TYPE | INSTANCE NAME | WIRE RULE TYPE |
|---|---|---|---|
| MODULE-A | RULES | | VLARGE_MODULE |
| MODULE-B | TIMING | | MEDIUM_MODULE |
| MODULE-C | FULL | | MEDIUM_MODULE |
| MODULE-D | DONT-TOUCH | | MEDIUM_MODULE |
| MODULE-E | TIMING | /MODULE-A/MODULE-B/MODULE-E | VSMALL_MODULE |
| MODULE-F | TIMING | /MODULE-A/MODULE-C/MODULE-F | VSMALL_MODULE |

FIG. 7

METHOD AND APPARATUS FOR PROVIDING OPTIMIZATION PARAMETERS TO A LOGIC OPTIMIZER TOOL

CROSS REFERENCE TO CO-PENDING APPLICATIONS

The present application is related to U.S. patent application Ser. No. 08/524,017, filed Aug. 29, 1995, entitled "A Method of Stabilizing Component and Net Names of Integrated Circuits In Electronic Design Automation Systems", and U.S. patent application Ser. No. 08/752,617, filed Nov. 19, 1996 entitled "Method and Apparatus For Incrementally Optimizing a Circuit Design", both assigned to the assignee of the present invention, and both incorporated herein by reference.

BACKGROUND OF THE INVENTION

1. Field of the Invention

This invention relates generally to electronic design automation (EDA) systems used for designing integrated circuits. The invention is more specifically related to a method and apparatus for providing optimization parameters to an EDA logic optimizing tool, and for viewing a number of optimization parameters via an interface.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form. Chip designers generally employ hierarchial design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

A common method for specifying the integrated circuit design is the use of hardware description languages. This method allows a circuit designer to specify the circuit at the register transfer level (also known as a "behavior description"). Using this method, the circuit is defined in small building blocks.

Encoding the design in a hardware description language (HDL) is a popular design entry technique used to specify modern integrated circuits. Hardware description languages are specifically developed to aid a designer in describing a circuit. These languages often contain specific functions and syntax to allow complex hardware structures to be described in a compact and efficient way.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a 2NAND component is specified as part of a given circuit design, it is given an instance name, to distinguish it from all other 2NAND gates used in the circuit. The instance name typically includes the instance names of all parent instances by concatenation when defining the instance in the context of the chip.

A single name is sufficient when dealing only in the context of a single user function. The user-defined blocks can then be used to design larger blocks of greater complexity. The user-defined blocks are added to the design library, which grows from the additions of new design modules as the design evolves. The top level of the design hierarchy may be a single block that defines the entire design, and the bottom layer of the hierarchy may consist of leaf cells, the cells (i.e., the logical components) that were originally provided in the cell library. The resulting design is often called a detailed (or gate-level) description of the logic design.

The generation of the detailed description is often accomplished by logic design synthesis software for HDL entry. The logic design synthesis software generates a gate-level description of user-defined input and output logic, and also creates new gate-level logic to implement user-defined logical functions. Typically, the logic design synthesis software is executed many times during the integrated circuit design process, because errors may be detected during the simulation and testing phases of the design cycle and then fixed in the behavioral description.

The output of the design capture and synthesis tools is a logic design database which completely specifies the logical and functional relationships among the components of the design. Once the design has been converted into this form, it may be optimized by sending the logic design database to a logic optimizer tool, typically implemented in software. One such logic optimizer tool is the Design Compiler, commercially available from Synopsys, Inc. The logic optimizer tool may optimize the design in accordance with a user specified optimization strategy. For example, typical logic optimizer tools may optimize selected portions of the design such that the area occupied thereby is minimized, or that the performance of the particular portion is maximized. Other optimization parameters may likewise be provided to the logic optimizer tool. These user specified optimization parameters provide a degree of user control over the logic optimizer tool, and the results produced thereby.

The optimization parameters are typically defined, and associated with, particular modules within a circuit design. For example, the circuit designer may identify those modules that are particularly critical to the performance of the design, including those modules that lie in critical timing paths. The designer may then provide optimization parameters for those modules, wherein the optimization parameters cause the logic optimizer tool to optimize the corresponding modules for maximum performance. Similarly, for those modules of the circuit design that are not in a critical timing path, the designer may provide optimization parameters such that the logic optimizer tool minimizes the area thereof.

Typical logic optimizer tools only optimize one circuit module at a time, starting with the circuit modules at the lowest level in the design hierarchy. Some logic optimizer tools provide a scan capability to scan the design hierarchy, and identify the relative hierarchical position of each circuit module within the overall design hierarchy. Thereafter, the logic optimizer tool may sequentially (i.e. one at a time) optimize each of the circuit modules in the lowest level in the design hierarchy. The logic optimizer tool may then sequentially optimize each of the circuit modules at the next higher level in the design hierarchy. This may be continued until the top level module is optimized.

Because of the sequential nature of the optimization process, it is important for the circuit designer to define the optimization parameters for each circuit module such that the optimization parameter sets are internally consistent with all other optimization parameter sets. That is, it is often left to the circuit designer to ensure that all of the optimization parameters are defined to be collectively self-consistent to achieve an optimum design.

This can be readily understood by considering an example wherein a critical path extends through a circuit design. As indicated above, it is often left to the circuit designer to ensure that the optimization parameters for each of the modules in the critical path are optimized for performance. In addition, it may be left to the circuit designer to compensate for the expected optimization of selected modules within the design. For example, optimizing a first module in a critical path for performance may provide sufficient timing relief, such that a second module in the critical path need not be optimized for performance. Alternatively, optimizing a first module for performance may cause the first module to become excessively large. Because the selection of the optimization parameters is often left to the circuit designer, it may be important for the circuit designer to be aware of the optimization parameters of related circuit modules within a design.

For typical logic optimizer tools, circuit designers may enter the optimization parameters either directly, such as by using a keyboard. That is, the logic optimization tool may prompt the circuit designer for the desired optimization parameters as a particular module is being processed. This method clearly is time-consuming, error prone and tedious.

Alternatively, the circuit designer may enter the optimization parameters directly into a pre-existing behavioral description, which is commonly written for each of the circuit modules, or into a separate script file. That is, the optimization parameters may be added to pre-existing HDL (VHSIC Hardware Description Language) models, wherein a HDL models exists for each of the circuit modules within the design. Similarly, the optimization parameters may be entered via a number of separate script files, wherein each of the number of separate script files correspond to one of the circuit modules. The separate script files are typically entered using a text editor, and may include a number of script commands that can be directly executed by the logic optimizer tool.

Providing the logic optimization parameters in separate script or HDL files for complex designs, having hundreds of modules and many levels of design hierarchy, is often error-prone, tedious and may result in a less than optimal design. That is, entering the parameters into separate script files for each of the modules in the design (either in the HDL code or a separate script file), and thereafter debugging each of the script files can be error prone and tedious.

In addition, because each of the optimization parameter sets are provided in separate files, viewing a number of optimization parameters for related modules is often difficult and/or cumbersome. As indicated above, viewing the optimization parameters for a number of modules within a design is often desirable, since the interplay between the optimization parameters can impact the overall optimized result. Accordingly, an efficient way to view all of the optimization parameters may allow the circuit designers to more easily recognize key relationships between related optimization parameters, and thus may provide a more efficient overall result.

SUMMARY OF THE INVENTION

The present invention overcomes many of the disadvantages of the prior art by providing a method and apparatus for providing optimization parameters to a logic optimizing tool. The optimization parameters for selected circuit modules may be stored such that the corresponding optimization parameters can be collectively viewed by the circuit designer. The optimization parameters may further be stored such that a particular optimization parameter set can be uniquely identified by a search capability of the data processing system, thereby enabling the logic optimizer tool to select and access a particular optimization parameter set from a collection of optimization parameter sets.

In a preferred embodiment, all of the optimization parameters for a particular design are stored in a single optimization file. As such, all of the optimization parameters can be collectively viewed and edited using a text editor, a spreadsheet, a menu or any other means. Accordingly, the circuit designer can enter, modify and/or view all of the optimization parameters for a circuit design using a single interface.

A search capability of a data processing system can be used to search through the number of optimization parameter sets to identify the optimization parameter set that corresponds to the selected circuit module. Thereafter, the identified optimization parameter set may be provided to the optimization tool for optimization of the corresponding circuit module. In a preferred embodiment, all of the optimization parameter sets are stored in a single file, and the search capability is provided by a text parser/editor. The logic optimizer tool simply calls the text parser/editor, supplying the appropriate variables and commands, wherein the text parser/editor searches through the optimization parameter file and returns the appropriate optimization parameter set to the logic optimizer tool. This feature enables the optimization tool to access a particular optimization parameter set from a collection of optimization parameter sets, with relative ease.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 7 illustrates an exemplary spread sheet interface for displaying, editing and/or viewing selected optimization parameters in accordance with the present invention;

DETAILED DESCRIPTION OF THE PREFERRED EMBODIMENTS

Figure 1:
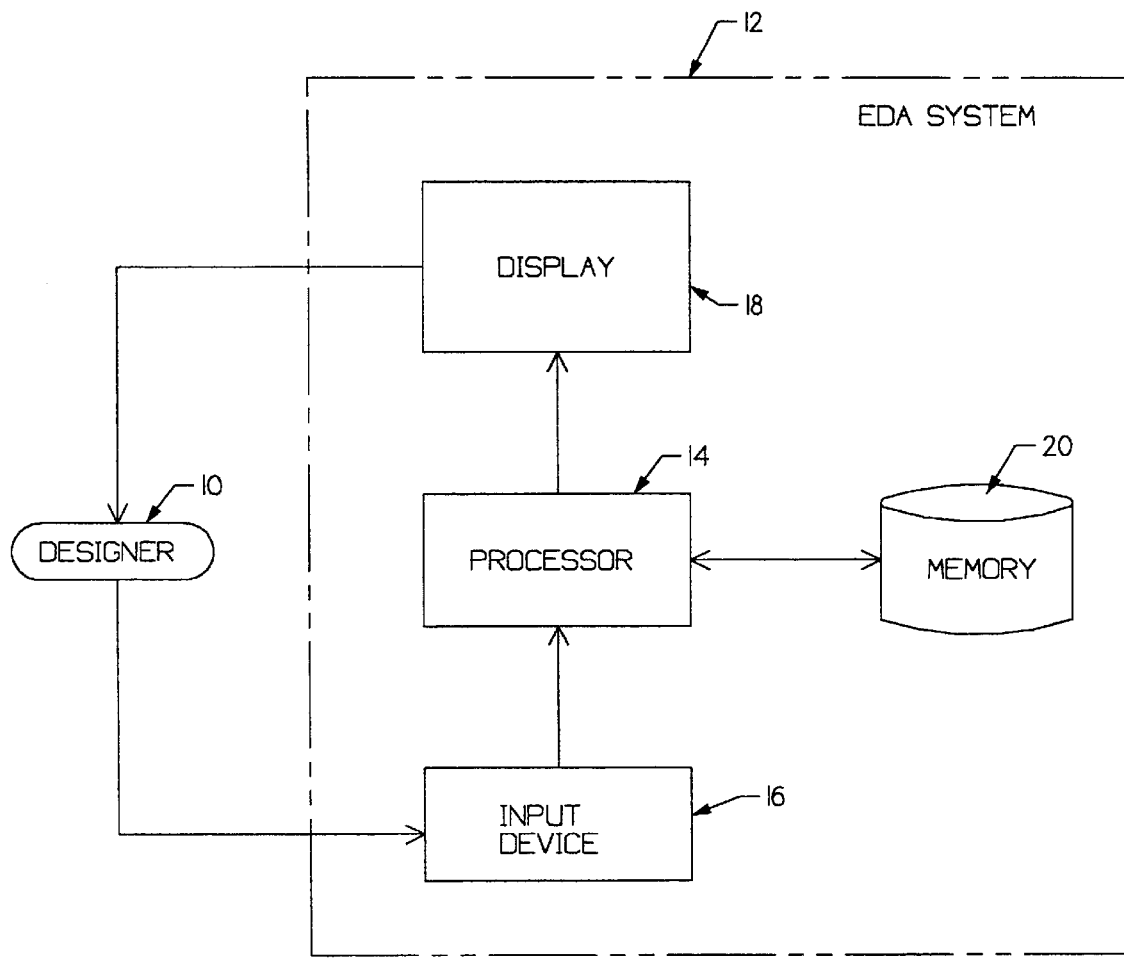
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

FIG. 1 is a block diagram of the computer-based environment of the present invention. A Designer 10 interacts with an Electronic Design Automation (EDA) System 12 to enter an integrated circuit design, optimize the design, validate the design, place the design's. components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 20. The Memory may take the form of a semiconductor memory, magnetic disks, optical disks, magnetic tape or other mass storage device.

Figure 2:
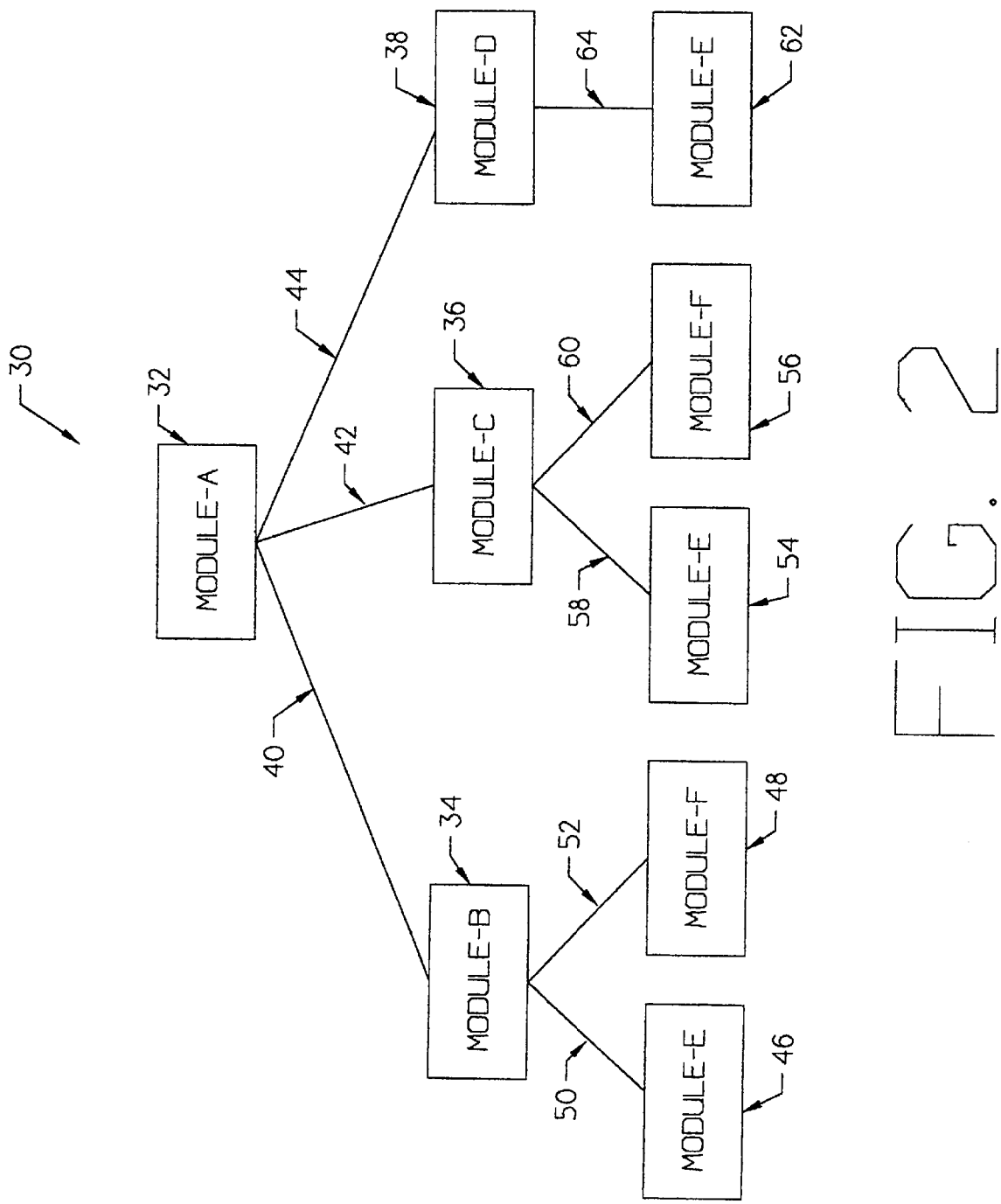
FIG. 2 is a block diagram showing an exemplary design hierarchy within a circuit design database.

FIG. 2 is a block diagram showing an exemplary design hierarchy within a circuit design database. The diagram is generally shown at 30. A top level module-A 32 is provided, and may represent the top hierarchial level in the exemplary circuit design database. Module-A 32 may include references to module-B 34, module-C 36, and module-D 38 as shown at 40, 42, and 44, respectively. Module-B 34, module-C 36, and module-D 38 represent the next lower level of design hierarchy in the circuit design database.

Module-B 34 may include references to module-E 46 and module-F 48 as shown at 50 and 52, respectively. Similarly, module-C 36 may include references to module-E 54 and module-F 56, as shown at 58 and 60, respectively. Finally, module-D 38 may include a reference to module-E 62, as shown at 64. Modules 46, 48, 54, 56 and 62 represent the lowest level in the design hierarchy of the circuit design database, and may be "leaf cells". That is, modules 46, 48, 54, 56, and 62 may be components from a vendor provided cell library.

It is noted that the same module, for example module-E, may be referenced by module-B 34, module-C 36, and module-D 38. To distinguish module-E 46, module-E 54 and module-B 62 from one another, a unique instance name may be provided, thereby allowing each module to be uniquely identified. Similarly, module-F 48 and module-F 56 may be provided with a unique instance name.

It is recognized that in practice, the circuit design database is typically much more complex, containing many more levels of design hierarchy and thousands of modules. That is, the circuit design database shown in FIG. 2 is only presented to illustrate the basic structure of a typical design database.

Figure 3:
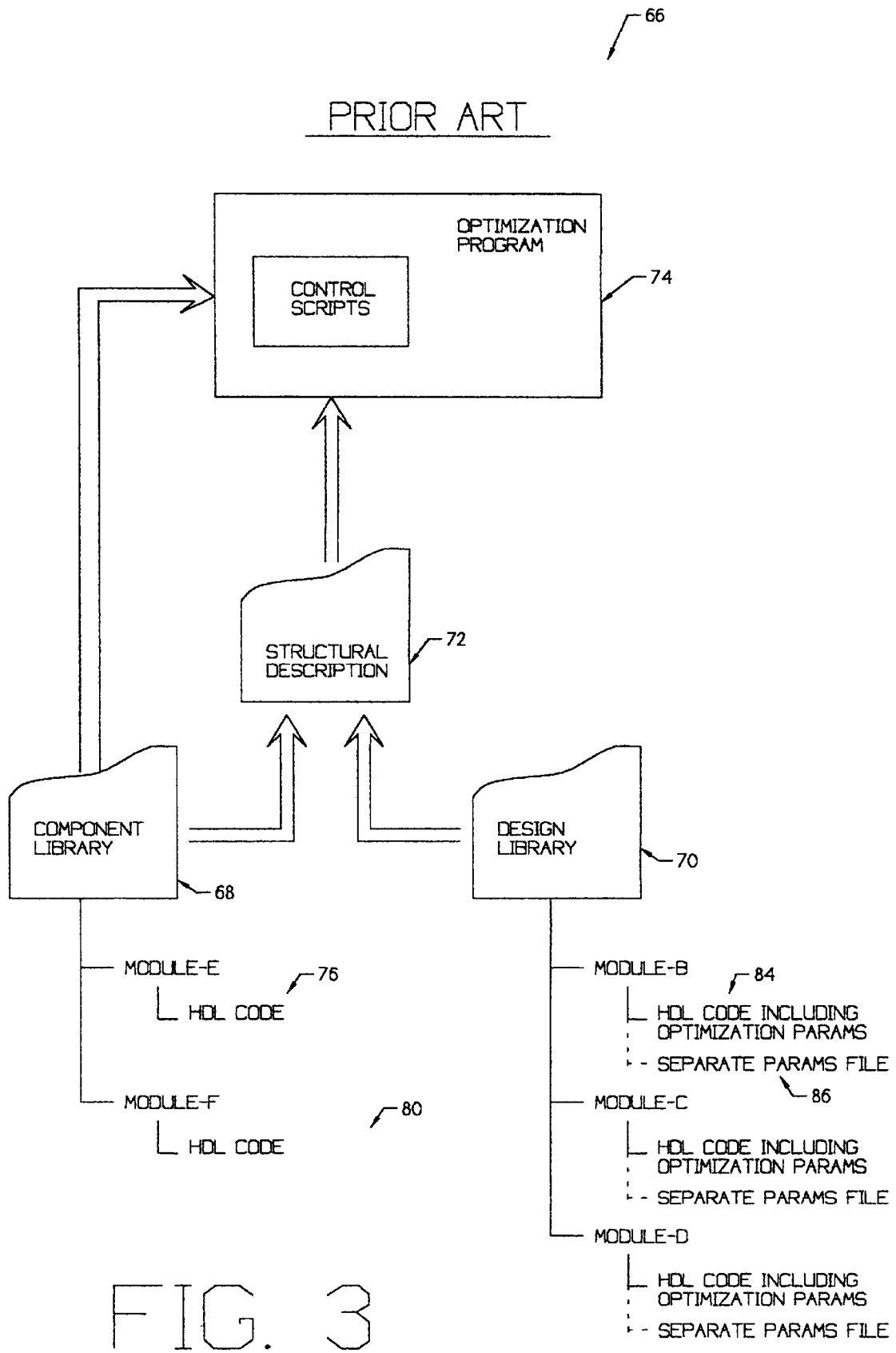
FIG. 3 is a block diagram showing a typical prior art design database structure including the definition of the optimization parameters in the HDL code of each of the circuit modules.

FIG. 3 is a block diagram showing a typical prior art design database structure, including the definition of the optimization parameters in an HDL code of each of the circuit modules. The diagram is generally shown at 66. A structural description of the circuit design is shown at 72, including references to a component library 68 and a design library 70. Referring to FIG. 2 and FIG. 3 collectively, the component library 68 may include module-E and module-F. Each module within the component library 68 may include a HDL model (written in tool specific modeling language), as shown. Each of the modules in the design library 70 may include either a HDL model, as shown at 84, including specific optimization parameters, or a separate optimization parameter file 86.

The structural description 72 may correspond to the top level module-A 32 of FIG. 2, and may include references to both the component library 68 and the design library 70. The structural description 72 may be provided to an optimization program (or tool) 74 as shown. As indicated above, typical logic optimizer tools 74 only optimize one circuit module at a time, starting with the circuit modules at the lowest level in the design hierarchy. Some logic optimizer programs provide a scan capability to scan the structural description 72, and identify the relative hierarchial position of each module within the overall design hierarchy. Thereafter, the logic optimizer program may sequentially (i.e., one at a time) optimize each of the circuit modules in the lowest level in the design hierarchy. Thereafter, the logic optimizer tool may sequentially optimize each of the circuit modules at the next higher level in the design hierarchy. This is continued until the top level module is optimized.

In view thereof, the optimization program 74 may scan the structural description 72 and identify the relative hierarchial positions of each of the circuit modules (see FIG. 2). Thereafter, the logic optimizer tool may sequentially optimize module-E 46 and module-F 48, using technology files stored in component library 68 that may include functions, timing, area, electrical loading parameters, etc. for each cell. Because both module-E and module-F are referenced by a number of higher level modules, for example module-B 34 and module-C 36, the user may specify which instance of module-E and module-F are to be optimized.

After the selected instances of module-E and module-F have been optimized, the optimizer program may sequentially optimize each of the circuit modules at the next higher level in the design hierarchy while marking the lower levels as previously optimized, including module-B 34, module-C 36, and module-D 38. Finally, the optimization program 74 may optimize the top level module-A 32 and store the result.

As indicated above, each module is processed (or optimized) by the optimization program 74 in a sequential manner. That is, the optimization program only optimizes a single module at any given time. During the optimization of a particular module, the optimization program may read either the HDL code, including the specific optimization parameters for the module, or the separate optimization parameter file that corresponds to that module. The optimization program 74 may then optimize the particular module in accordance with the optimization parameters provided.

Figure 4:
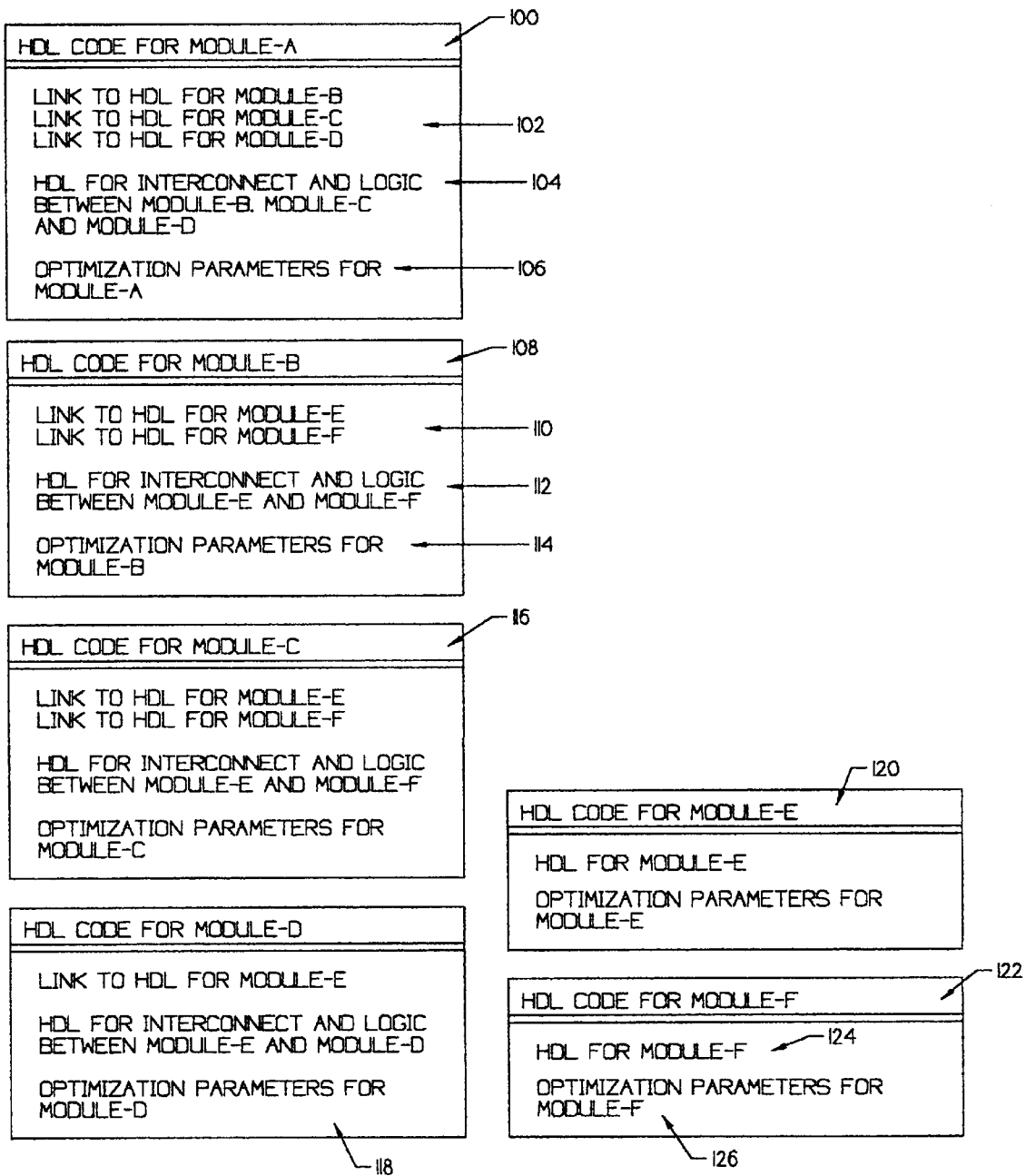
FIG. 4 illustrates a typical HDL code structure for the design database shown in FIG. 2.

FIG. 4 illustrates a typical HDL code structure for the design database shown in FIG. 2. The HDL code for the top level module-A 32 is generally shown at 100. The HDL code may include links to the HDL code for modules-B, C and D, as shown at 102. Further, the HDL code for the top level module-A may describe the interconnect and logic between modules-B, C and D, as shown at 104. Finally, the HDL code for module-A may include specific optimization parameters for module-A.

Likewise, the HDL code for module-B is generally shown at 108. The HDL code for module-B may include links to the HDL code for modules-E and F, as shown at 110. Further, the HDL code for module-B may describe the interconnect and logic between modules-E and F, as shown at 112. Finally, the HDL code for module-B may include specific optimization parameters for module-B, as shown at 114.

The HDL code for modules-C, D, E, and F are shown at 116, 118, 120, and 122, respectively. As shown at 122, the HDL code for module-F may describe the interconnect and logic of module-F as shown at 124, and may further include the specific optimization parameters for module-F, as shown at 126.

Figure 5:
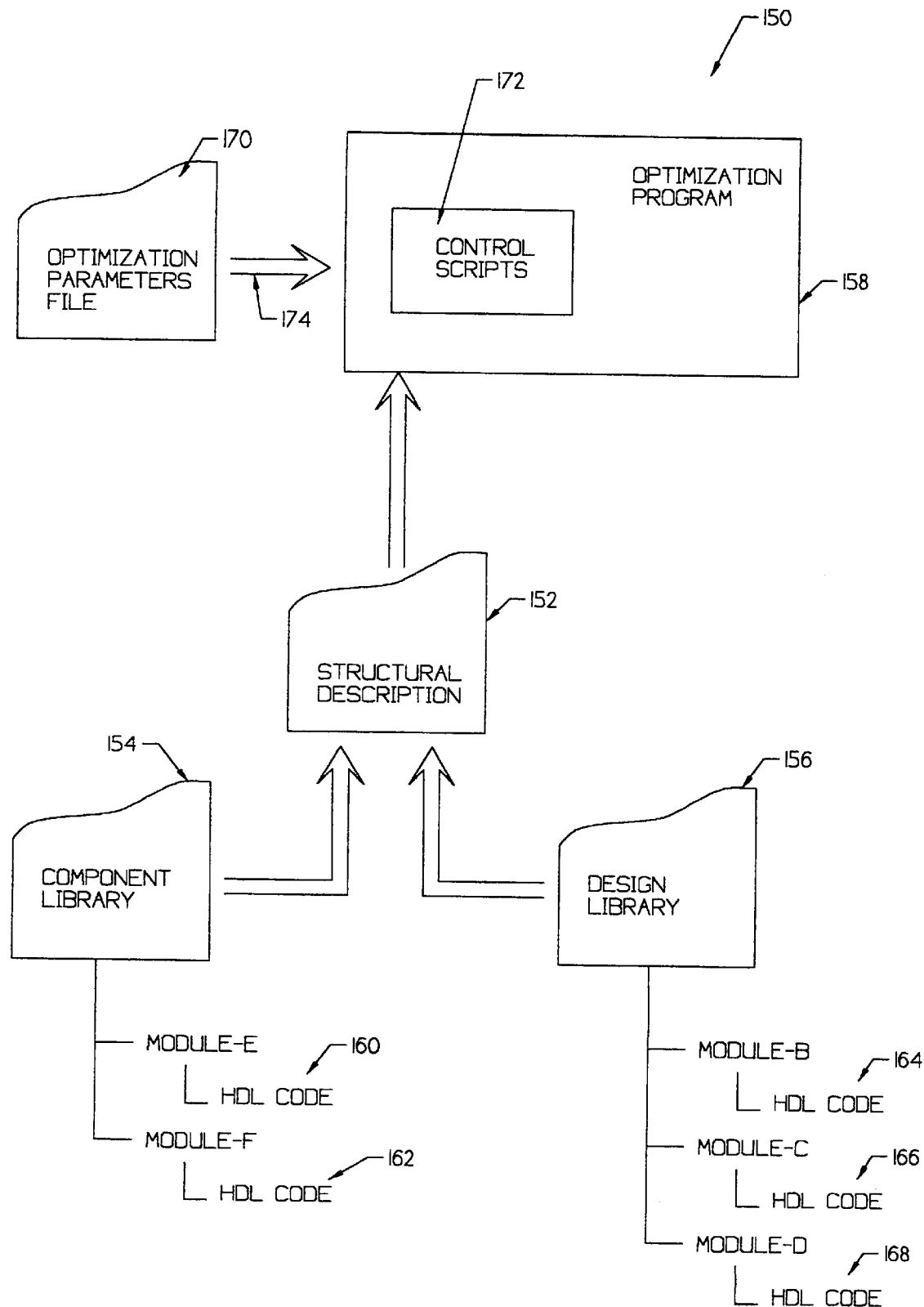
FIG. 5 is a block diagram showing an exemplary design database structure of the present invention, including the storage of selected optimization parameters in a predetermined location.

FIG. 5 is a block diagram showing an exemplary design database structure of the present invention, including the storage of selected optimization parameters in a predetermined location. The diagram is generally shown at 150. The structural description 152 of the circuit design may include references to both a component library 154 and a design library 156. The component library 154 may include modules-E and F as shown (see FIG. 2). Each of the modules in the component library 154 may include a HDL model as shown at 160 and 162. However, and in contrast to the prior art described with reference to FIG. 3, the HDL model for the respective modules is not required to contain specific optimization parameters,. Further, a separate optimization parameter file is not required for each of the modules.

Similarly, the design library 156 may include modules-B, C, and D, as shown. Each of the modules within the design library 156 may include a HDL model, as shown at 164, 166, and 168. As indicated above, the present invention does not require that the HDL model include specific optimization parameters therein. Further, a separate optimization parameter file is not required for each of the modules.

Rather than providing the optimization parameters in a HDL model or in a separate parameter file for each module within the design, a preferred mode of the present invention contemplates providing all of the optimization parameters in a single optimization parameters file, as shown at 170.

In operation, the optimization program 158 may read the structural description 152 as shown, and may sequentially optimize each one of the modules therein as described above. When a particular module is selected for optimization, the optimization program may read the HDL code from either the component library 154 or the design library 156. Further, the optimization program 158 may read the corresponding optimization parameter set from the optimization parameter file 170, via interface 174. To find the appropriate optimization parameter set amongst all of the optimization parameter sets stored in the optimization parameter file 170, a search capability of the data processing system may be used to search through the number of optimization parameter sets and identify the optimization parameter set that corresponds to the selected circuit module. Thereafter, the identified optimization parameter set may be provided to the optimization program 158 for optimization of the corresponding circuit module.

In a preferred embodiment, all of the optimization parameter sets for each of the modules in the circuit design are stored in a single file, and the search capability is provided by a text parser/editor. Control scripts 172 of the optimization program 158 simply call the text parser/editor and supply the appropriate variables and commands to the text parser/editor. The text parser/editor may then search through the optimization parameter file 170, and may return the appropriate optimization parameter set to the optimization program 158. This feature enables the optimization program 158 to access a particular optimization parameter set from a collection of optimization parameter sets with relative ease.

In accordance with the present invention, all of the optimization parameters can be collectively viewed and edited using a text editor, a spreadsheet, a menu, or any other means. Accordingly, the circuit designer can enter, modify and/or view all of the optimization parameters for a circuit design using a single interface. As indicated above, viewing the optimization parameters for a number of modules within a design is often desirable, since the interplay between the optimization parameters can impact the overall optimized result. As such, the present invention provides an efficient way to collectively view all or some of the optimization parameters for a circuit design, thereby allowing circuit designers to more easily recognize key relationships between related optimization parameters. This may result in a more efficient overall design.

It is understood that the present invention is not limited to providing all optimization parameters for a particular design in a single optimization parameter file, as shown at 170. It is contemplated that the optimization parameters for selected circuit modules may be stored in any manner that allows the corresponding optimization parameters to be collectively viewed by the circuit designer. Further, it is contemplated that the optimization parameters for selected circuit modules may be stored such that a particular optimization parameter set can be uniquely identified by a search capability of the data processing system, thereby enabling the optimization program 158 to select and access a particular optimization parameter set from a collection of optimization parameters.

Figure 6:
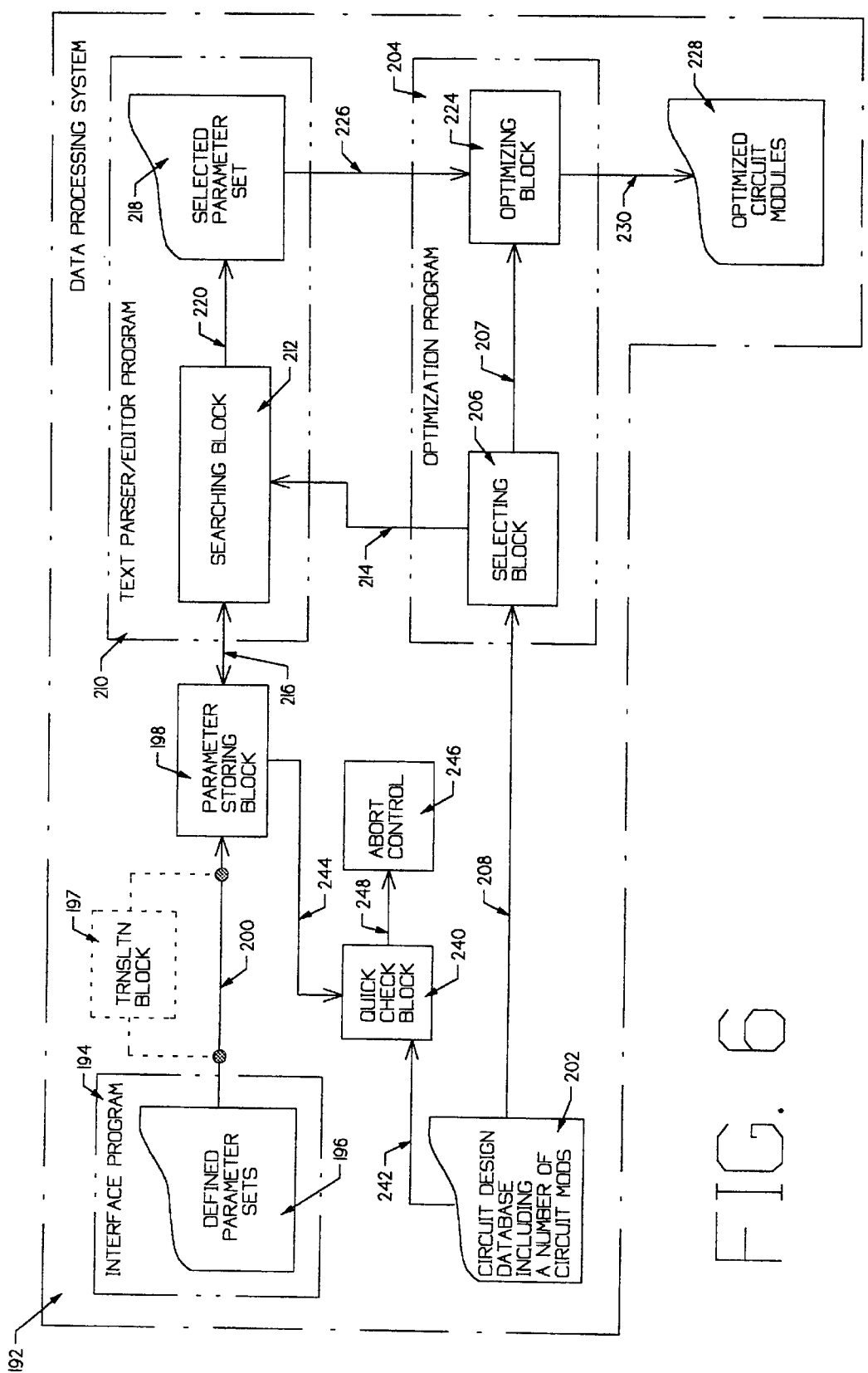
FIG. 6 is a block diagram showing a first exemplary data processing system in accordance with the present invention.

FIG. 6 is a block diagram showing a first exemplary data processing system in accordance with the present invention. The data processing system is generally shown at 192, and generally includes an interface block 194, a parameter storing block 198, a searching block 212, a selecting block 206, and an optimizing block 224. The interface block 194 provides access to the defined optimization parameter sets 196. The interface block 194 may be implemented in hardware or software, or a combination thereof. In a preferred embodiment, the interface block 194 is a spreadsheet, menu, or text editor running on a data processing machine. The interface block 194 may provide the optimization parameter sets to the parameter storing block 198 via interface 200.

The parameter storing block 198 may store the optimization parameters for selected circuit modules such that the corresponding optimization parameters can be collectively viewed by a circuit designer via the interface block 194. Further, the optimization parameters may be stored such that a particular optimization parameter set can be uniquely identified by a searching block 212 (see below) of the data processing system 192.

The data processing system 192 may store a circuit design database including a number of circuit modules as shown at 202. A selecting block 206 may read the circuit design database, and select a particular module for optimization. The selecting block 206 may notify the searching block 212 of the selected module. The searching block 212 may search the number of optimization parameters, stored by the parameter storing block 198 via interface 216, for the optimization parameter set that corresponds to the selected module. The parameter set that corresponds to the selected circuit module is provided as a selected optimization parameter set as shown at 218. An optimizing block 224 may read the selected optimization parameter set 218 via interface 226, and may further read the selected circuit module via interface 207. The optimizing block 224 may optimize the selected circuit module in accordance with the selected optimization parameter set, and the result may be stored as an optimized circuit module 228 via interface 230.

It is contemplated that the searching block 212 may be implemented either in hardware, software or a combination thereof. In a preferred embodiment, the searching block 212 is implemented as a text parser/editor program, as shown at 210. The selecting block 206 and optimizing block 224 may also be implemented in either hardware, software or a combination thereof. In a preferred embodiment, the selecting block 206 and optimizing block 224 are implemented using an optimization program, such as the design compiler commercially available from Synopsys, Inc.

In addition to the above, it is contemplated that a quick check block 240 may be provided. The quick check block 240 may read the circuit design database via interface 242, and may read the optimization parameter sets stored by parameter storing block 198 via interfaces 244. Typically, the quick check block 240 may check to ensure that each of the modules in the circuit design database has a corresponding optimization parameter set.

If the quick check block 240 detects that a circuit module does not have a corresponding optimization parameter set, an abort control block 246 is notified via interface 248. Abort control block 246 may abort the optimization of the circuit design database before any significant processing time is wasted. In a preferred embodiment, the quick check block 240 reads the name of each module within the circuit design database, and checks for the corresponding optimization parameter set using a search capability of a text parser/editor. That is, the quick check block 240 provides the circuit module name to a text parser/editor, wherein the text parser/editor searches for the corresponding optimization parameter set.

The verification feature provided by the quick check block 240 can be an important time saver because any omissions of data, and in particular an omission of an optimization parameter sets, may be detected before any processing time is wasted by the optimization program 204. It has been found that the optimization of a typical design may require between 2 and 8 days of execution time. Thus, the quick check block 240 can often cut days off of a design cycle.

Referring back to the interface block 194, it is contemplated that the interface block 194 may provide a data format that is not compatible with the parameter storing block 198. Under these circumstances, it is contemplated that a translation block 197 may be provided between the interface block 194 and the parameter storing block 198. The translation block 197 may translate the optimization parameter sets from the data format provided by the interface block 194 to the data format that is required by the parameter storing block 198. This may occur when, for example, the interface block 194 is implemented using a spreadsheet program and the parameter storing block 198 requires a text editor format. The translation block 197 may then translate the optimization parameter sets from the spreadsheet data format to the text editor format, as required.

FIG. 7 illustrates an exemplary spreadsheet interface for displaying, editing and/or viewing selected optimization parameters in accordance with the present invention. The illustrative spreadsheet interface includes a module name column 262, an optimization type column 264, an instance name column 266, and a wire rule type column 268. The module name column 262 includes the name of selected modules within the circuit design database. For example, and with reference to FIG. 2, module-A through module-F are shown. The optimization type column 264 shows the optimization strategy selected for each of the corresponding modules. For example, module-B is to be optimized to maximize performance (i.e. timing), as shown at 272. Similarly, module-D, is not to be optimized at all (i.e. dont-touch), as shown at 278.

The instance name column 266 provides a place for the user to specify the instance name of a particular module that should be optimized. For example, and with reference to FIG. 2, module-E is referenced by module-B 34, module-C 36, and module-D 38. As shown in FIG. 7, module-E is to be optimized to maximize performance as shown at 284, and the instance referenced by module-B 34 is the critical instance. Thus, any timing constraints applied to module-E 46 (see FIG. 2) will be used during the optimization process of module-E 46 The other instances of module-E, including module-E 54 and module-E 62, may use the previously optimized version of module-E 46.

Finally, the wire rule type column 268 indicates which wire rule model to use when optimizing the corresponding modules. For example, module-B as shown at 270, has a wire rule type of "MEDIUM_MODULE". This indicates that module-B 34 (see FIG. 2) is expected to be of medium size. Similarly, module-E as shown at 280 has a corresponding wire rule type of "VSMALL_MODULE" as shown at 288. This indicates that the selected instance of module-E, and in particular, module-E 46 (see FIG. 2), is expected to be a very small module.

It is understood that the parameters provided for each of the modules as shown in FIG. 7 are only illustrative, and that other optimization parameters are contemplated.

Figure 8:
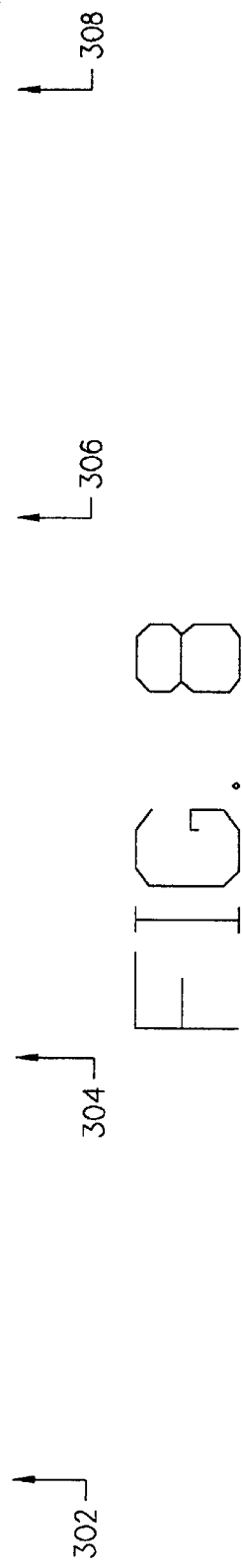
FIG. 8 illustrates an exemplary menu interface for displaying, editing and/or viewing selected optimization parameters in accordance with the present invention.

FIG. 8 illustrates an exemplary menu interface for displaying, editing and/or viewing selected optimization parameters in accordance with the present invention. The diagram is generally shown at 300, and includes a module name column 302, a "COMPILE_TYPE" column 304, an instance name column 306, and a wire rule column 308. The module name column 302 may include the names of each of the modules within the circuit design. It is contemplated that the menu interface may read the circuit design database and automatically include the module names of each of the modules in the circuit design database. The user may then select the appropriate "COMPILE_TYPE" for the corresponding module, as shown at 304 The "COMPILE_TYPE" column 304 corresponds to the optimization type column 264 of FIG. 7, and indicates the optimization strategy for the particular module. Similarly, the menu may provide data entry block to allow the user to specify a specific instance name. The user may either directly type in the instance name, or a sub-menu may be provided wherein the user is allowed to browse through the circuit design database and select the appropriate instance therein. Finally, a number of options may be provided in the wire rule column 308 as shown, wherein the user may simply click or check the appropriate wire rule model as desired.

Figure 9:
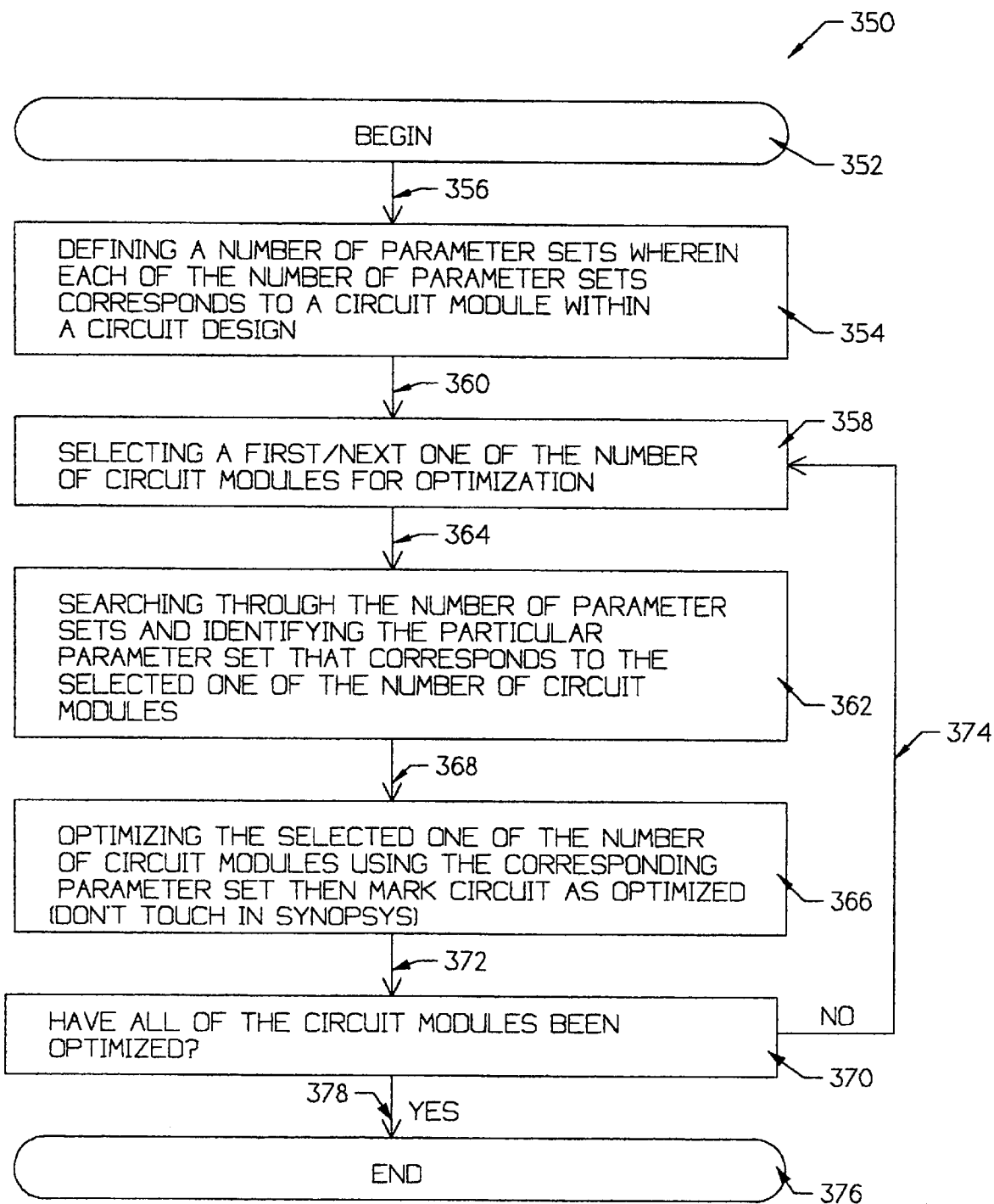
FIG. 9 is a flow diagram showing a first exemplary method of the present invention.

FIG. 9 is a flow diagram showing a first exemplary method of the present invention. The flow diagram is generally shown at 350. The algorithm is entered at element 352, wherein control is passed to element 354 via interface 356. Element 354 defines a number of parameter sets, wherein each of the number of parameter sets corresponds to a circuit module within a circuit design. This may be either performed automatically, by a circuit designer, or a combination thereof. Control is then passed to element 358 via interface 360. Element 358 selects a first/next one of the number of circuit modules for optimization. Control is then passed to element 362 via interface 364. Element 362 searches through the number of parameter sets and identifies the particular parameter set that corresponds to the selected one of the number of circuit modules. Control is then passed to element 366 via interface 368. Element 366 optimizes the selected one of the number of circuit modules using the corresponding parameter set, and marks the circuit as optimized. Control is then passed to element 370 via interface 372. Element 370 determines if all of the circuit modules have been optimized. If all of the circuit modules have not been optimized, control is passed back to element 358 via interface 374, wherein a next one of the number of circuit modules is selected. If, however, all of the circuit modules have been optimized, control is passed to element 376 via interface 378, wherein the algorithm is exited.

Figure 10:
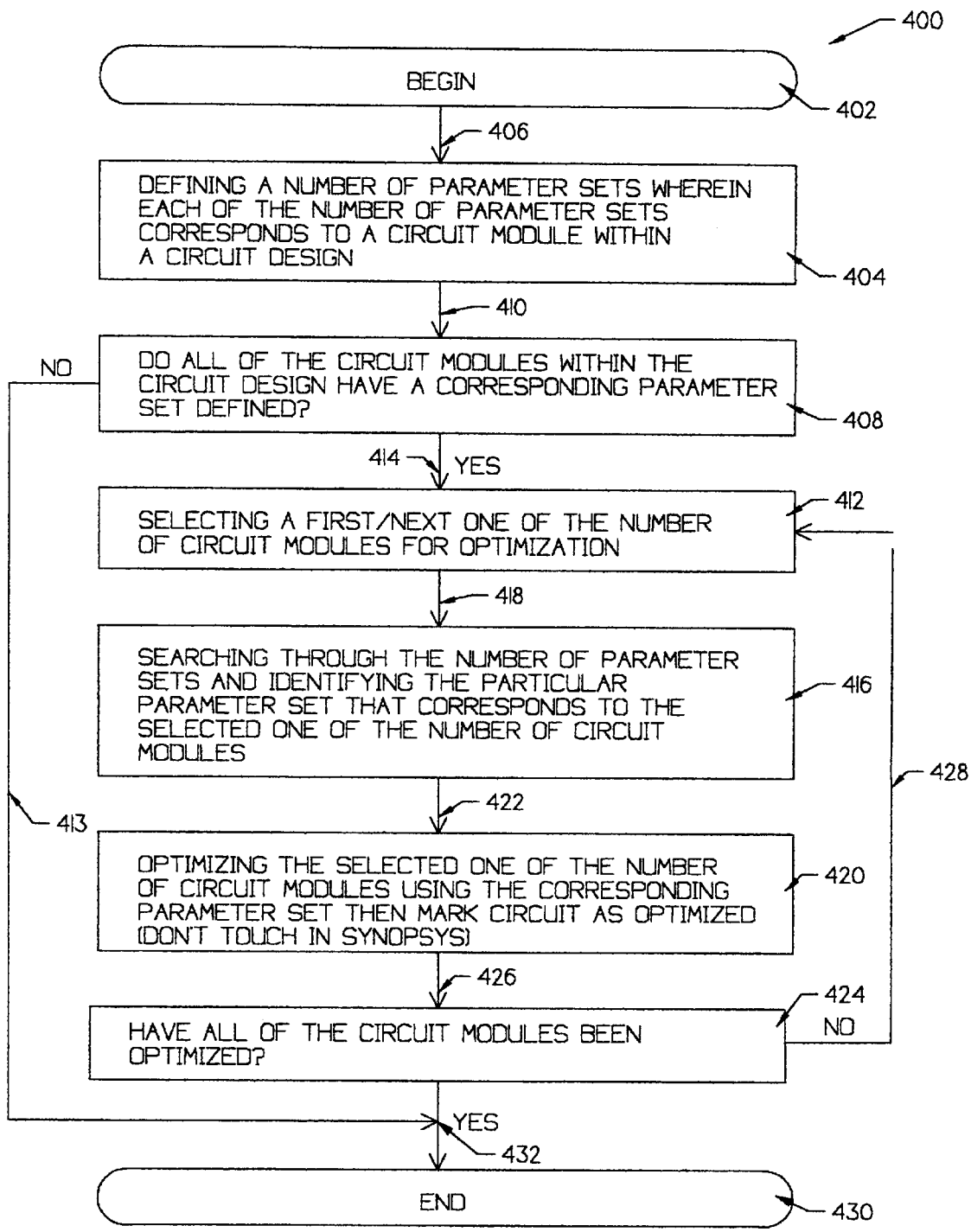
FIG. 10 is a flow diagram showing a second exemplary method of the present invention.

FIG. 10 is a flow diagram showing a second exemplary method of the present invention. The algorithm is generally shown at 400. The algorithm is entered at 402, wherein control is passed to element 404 via interface 406. Element 404 defines the number of parameter sets wherein each of the number of parameter sets corresponds to a circuit module within a circuit design. Control is then passed to element 408 via interface 410. Element 408 determines if all of the circuit modules within the circuit design have a corresponding parameter set defined. If all of the circuit modules within the circuit design do not have a corresponding parameter set defined, control is passed to element 430 via interface 413, wherein the algorithm is exited.

If, however, all of the circuit modules within the circuit design have a corresponding parameter set defined, control is passed to element 412 via interface 414. Element 412 selects a first/next one of the number of circuit modules for optimization. Control is then passed to element 416 via interface 418. Element 416 searches through the number of parameter sets and identifies the particular parameter set that corresponds to the selected one of the number of circuit modules. Control is then passed to element 420 via interface 422. Element 420 optimizes the selected one of the number of circuit modules using the corresponding parameter set, and marks the circuit as optimized. Control is then passed to element 424 via interface 426. Element 424 determines whether all of the circuit modules have been optimized. If all of the circuit modules have not been optimized, control is passed back to element 412 via interface 428. If, however, all of the circuit modules have been optimized, control is passed to element 430 via interface 432, wherein the algorithm is exited.

Figure 11:
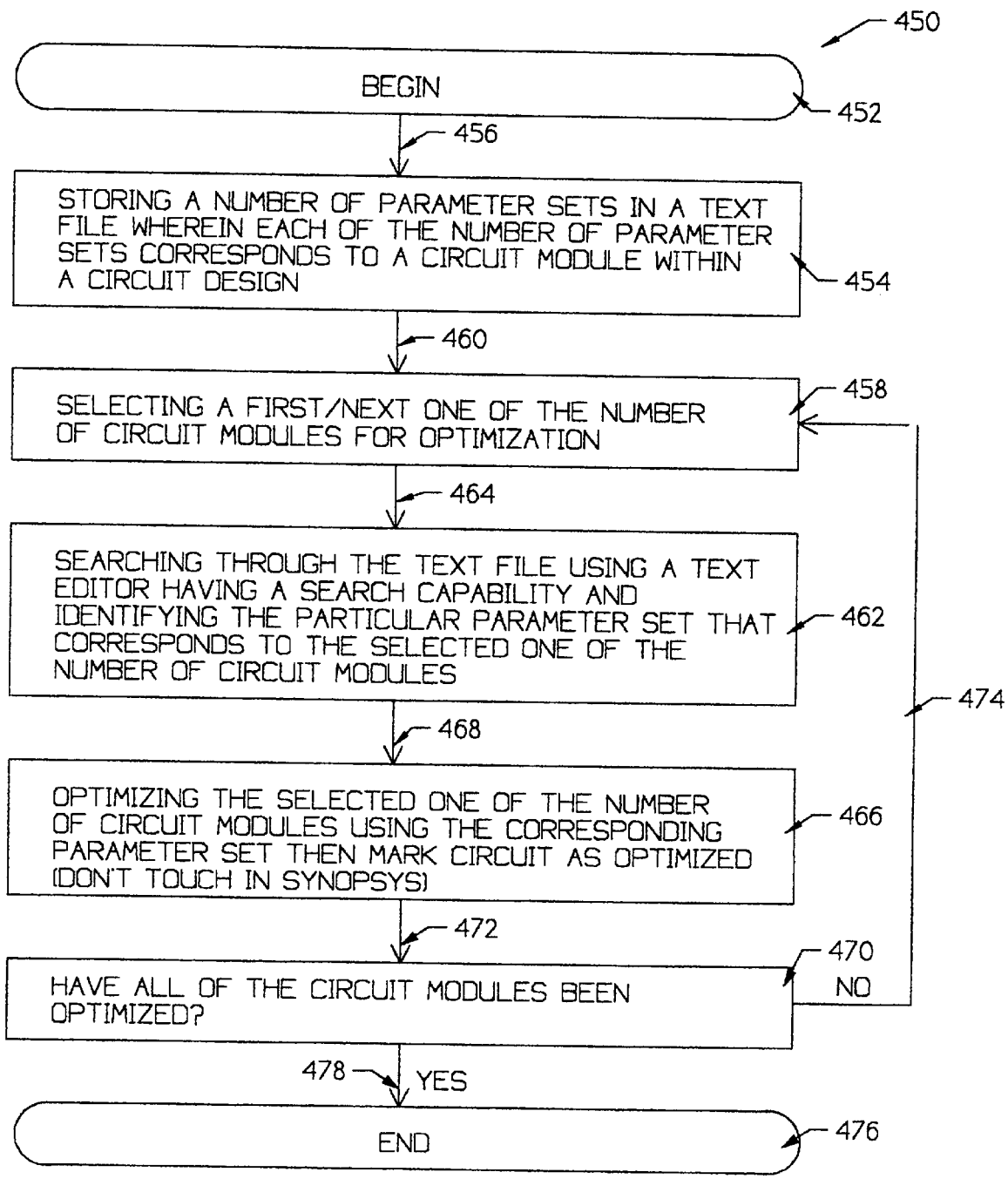
FIG. 11 is a flow diagram showing a third exemplary method of the present invention.

FIG. 11 is a flow diagram showing a third exemplary method of the present invention. The algorithm is generally shown at 450. The algorithm is entered at element 452, wherein control is passed to element 454 via interface 456. Element 454 stores a number of parameter sets in a text file, wherein each of the number of parameter sets corresponds to a circuit module within a circuit design. Control is then passed to element 458 via interface 460. Element 458 selects a first/next one of the number of circuit modules for optimization. Control is then passed to element 462 via interface 464. Element 462 searches through the text file using a text parser/editor having a search capability and identifies the particular parameter set that corresponds to the selected one of the number of circuit modules. Control is then passed to element 466 via interface 468. Element 466 optimizes the selected one of the number of circuit modules using the corresponding parameter set, and marks the circuit as optimized. Control is then passed to element 470 via interface 472. Element 470 determines whether all of the circuit modules have been optimized. If all of the circuit modules have not been optimized, control is passed back to element 458 via interface 474. If, however, all of the circuit modules have been optimized, control is passed to element 476 via interface 478, wherein control is exited.

Figure 12:
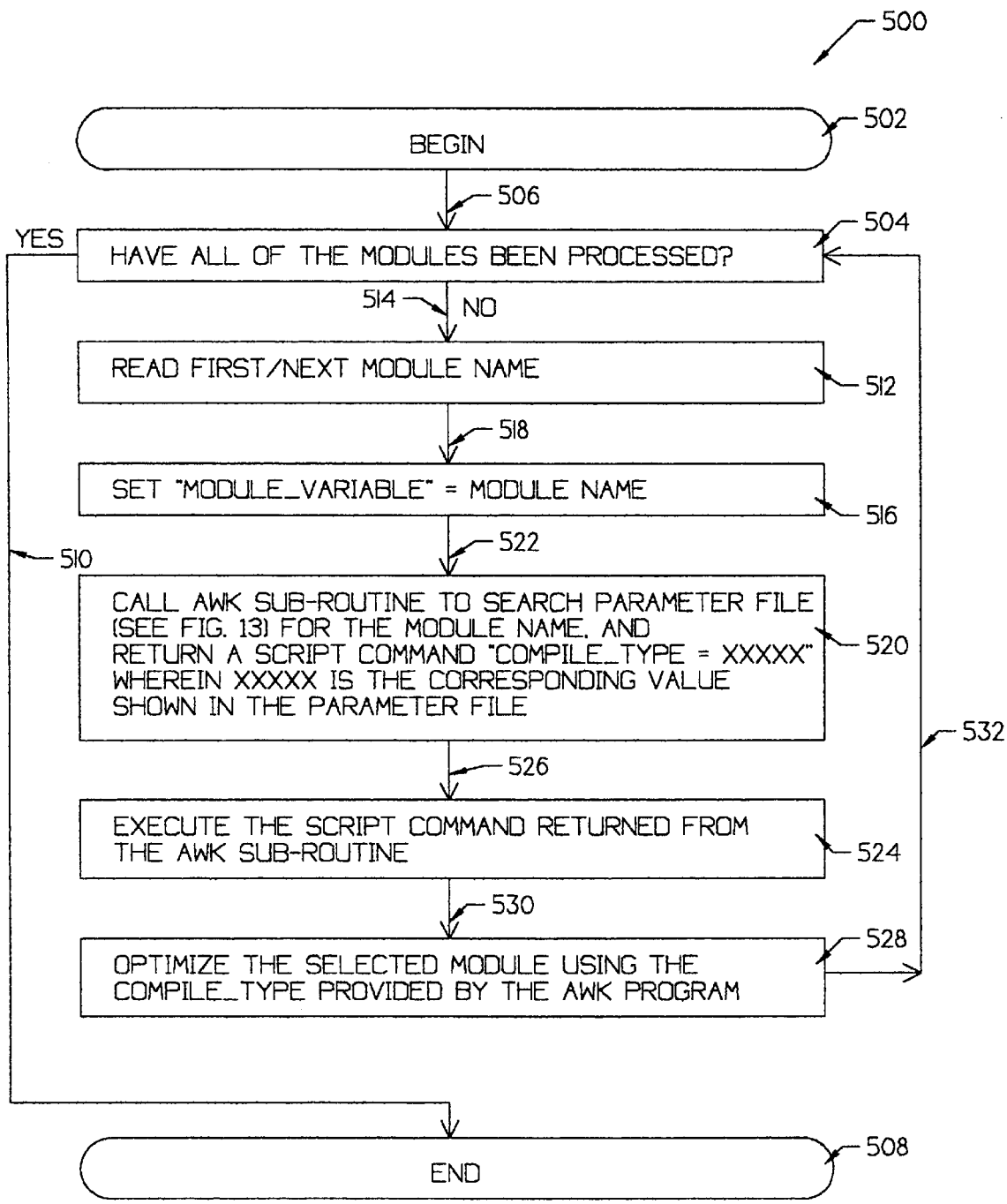
FIG. 12 is a flow diagram showing a fourth exemplary method of the present invention.

FIG. 12 is a flow diagram showing a fourth exemplary method of the present invention. The algorithm is generally shown at 500, and should be read in conjunction with the algorithm shown in FIG. 13. The algorithm is entered at element 502, wherein control is passed to element 504 via interface 506. Element 504 determines whether all of the modules have been processed. If all of the modules have been processed, control is passed to element 508 via interface 510, wherein control is exited.

If, however, all of the modules have not been processed, control is passed to element 512 via interface 514. Element 512 reads a first/next module name from the circuit design database. Control is then passed to element 516 via interface 518. Element 516 sets a "MODULE_VARIABLE= MODULE NAME". Control is then passed to element 520 via interface 522. Element 520 calls an AWK sub-routine to search the optimization parameter file (see FIG. 13) for the module name. "AWK" is a standard text parser/editor than runs in a UNIX environment. The AWK sub-routine returns a script command "COMPILE_TYPE=XXXX", wherein XXXX is the optimization strategy shown in the parameter file for the corresponding module. The "COMPILE_ TYPE=XXXX" is a script command that can be directly executed by the optimization program. Control is then passed to element 524 via interface 526. Element 524 executes the script command returned from the AWK subroutine. Control is then passed to element 528 via interface 530. Element 528 optimizes the selected module using the COMPILE_TYPE provided by the AWK program. Control is then passed back to element 504 via interface 532.

Figure 13:
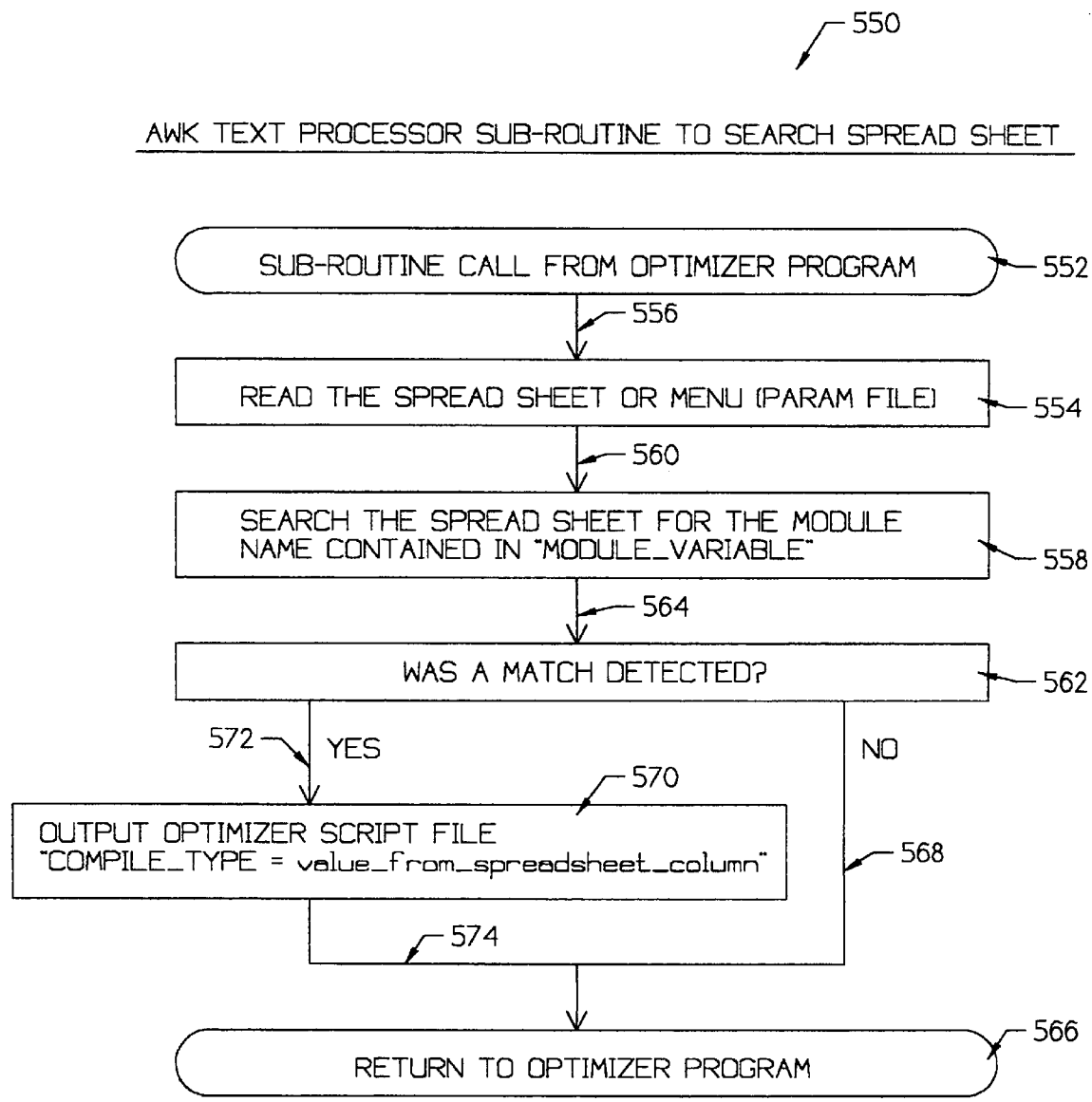
FIG. 13 is a flow diagram showing an exemplary text editor sub-routine for searching a spreadsheet database for a selected parameter set.

FIG. 13 is a flow diagram showing an exemplary text editor sub-routine for searching a spreadsheet database for a selected parameter set. The algorithm is generally shown at 550, and specifically references the AWK text processor. It is understood, however, that any text parsing routine may be used.

The sub-routine is initiated by a sub-routine call from the optimization program (see element 520 of FIG. 12). Control is then passed to element 554 via interface 556. Element 554 reads the spreadsheet (or menu or parameter file). Control is then passed to element 558 via interface 560. Element 558 searches the spreadsheet for the module name contained in "MODULE_VARIABLE" (see element 516 of FIG. 12). Control is then passed to element 562 via interface 564. Element 562 determines whether a match was detected. If a match was not detected, control is passed back to the optimizer program as shown at 566 via interface 568.

If a match was detected, control is passed to element 570 via interface 572. Element 570 outputs an optimizer script command, such as "COMPILE_TYPE=value_from-spreadsheet_column". Control is then returned to the optimizer program as shown at 566.

Figure 14:
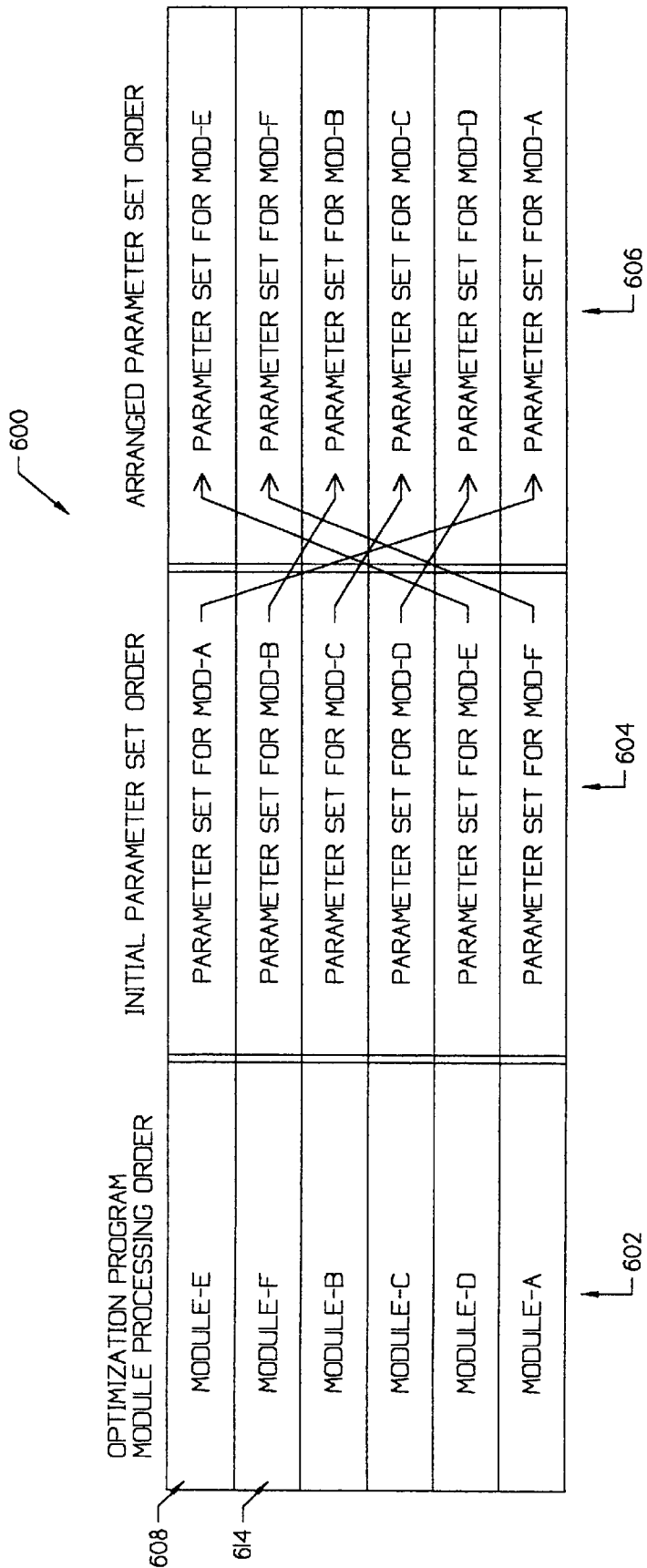
FIG. 14 illustrates another exemplary method of the present invention which comprises re-ordering the number of parameter sets to correspond to the order that the optimization tool optimizes the circuit modules.

FIG. 14 illustrates another exemplary method of the present invention which comprises re-ordering the number of parameter sets in an optimization parameter file to correspond to the order that the optimization program optimizes the circuit modules. The diagram is generally shown at 600 and includes an optimization program module processing order column 602, an initial parameter set order column 604, and an arranged parameter set order column 606.

As indicated above, typical logic optimizer tools only optimize one circuit module at a time, starting with the circuit modules at the lowest level in the design hierarchy. Some logic optimizer tools provide a scan capability to scan the design hierarchy, and identify the relative hierarchial position of each circuit module within the overall design hierarchy. Thereafter, the logic optimizer tool may sequentially (i.e., one at a time) optimize each of the circuit modules at the lowest level in the design hierarchy. Thereafter, the logic optimizer tool may sequentially optimize each of the circuit modules at the next higher level in the design hierarchy. This is continued until the top level module is optimized.

In view thereof, a typical optimization program may identify the order that each of the modules within the circuit design database will be optimized. This order can be used to arrange, or re-order, the initial optimization parameter sets to match the order of optimization. That is, rather than searching through the initial optimization parameter set file, each of the optimization parameter sets may be arranged to correspond to the order that the optimization program will optimize the corresponding modules. Thereafter, as each module is sequentially optimized, the corresponding optimization parameter set can be read from the arranged parameter set file. As such, no searching is required.

With reference to FIG. 2, modules-E and F exist at the lowest level in the design hierarchy. Thus, for typical logic optimizer tools, these modules would be optimized first as shown at 608 and 614. However, the order of the initial optimization parameter sets may not match the order that the optimization program will optimize the corresponding modules. Thus, it is contemplated that the optimization parameter sets in the initial optimization parameter file may be arranged, or re-ordered, to match the order that the modules are to be optimized by the optimization program.

Figure 15:
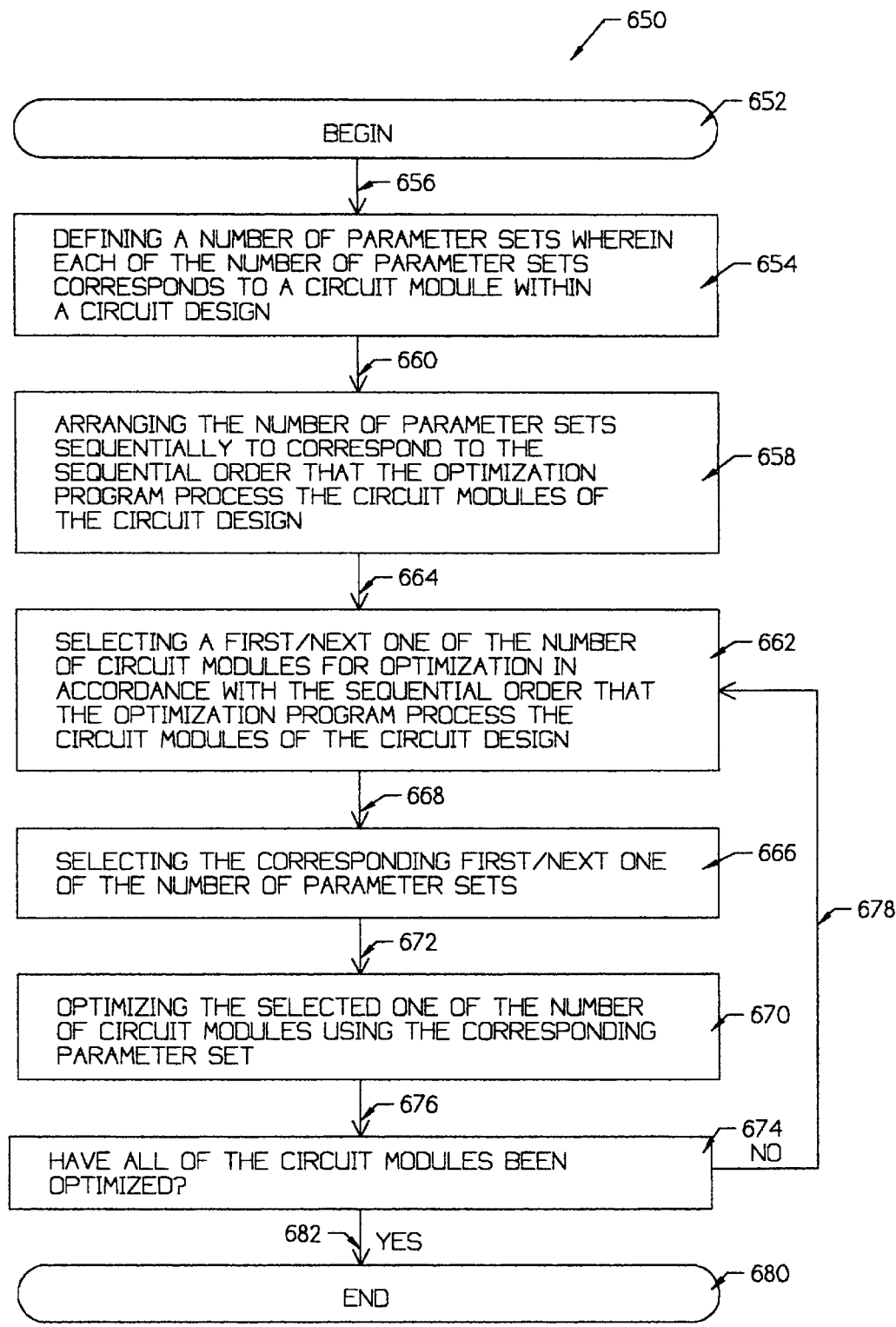
FIG. 15 is a flow diagram showing yet another exemplary method of the present invention.

FIG. 15 is a flow diagram showing yet another exemplary method of the present invention. The algorithm is generally shown at 650. The algorithm is entered at 652, wherein control is passed to element 654 via interface 656. Element 654 defines the number of parameter sets, wherein each of the number of parameter sets correspond to a circuit module within a circuit design. Control is then passed to element 658 via interface 660. Element 658 arranges, or re-orders, the number of parameter sets to correspond to the sequential order that the optimization program will processes the circuit modules of the circuit design. Control is then passed to element 662 via interface 664. Element 662 selects a first/next one of the number of circuit modules for optimization in accordance with the sequential order that the optimization program will processes the circuit modules of the circuit design. Control is then passed to element 666 via interface 668. Element 666 selects the corresponding first/next one of the number of optimization parameter sets. Control is then passed to element 670 via interface 672. Element 670 optimizes the selected one of the number of circuit modules using the corresponding optimization parameter set. Control is then passed to element 674 via interface 676. Element 674 determines whether all of the circuit modules have been optimized. If all of the circuit modules have not been optimized, control is passed back to element 662 via interface 678. If all of the circuit modules have been optimized, control is passed to element 680 via interface 682, wherein the algorithm is exited.

Having thus described the preferred embodiments of the present invention, those of skill in the art will readily appreciate that the teachings found herein may be applied to yet other embodiments within the scope of the claims hereto attached.

We claim:

1. A data processing system for optimizing a circuit design stored in a circuit design database, the circuit design database including a number of circuit modules wherein the optimization of selected ones of the number of circuit modules is selectively influenced by corresponding ones of a number of parameter sets, wherein said data processing system has a single interface for viewing said parameter sets, comprising:

a. storing means for storing the number of parameter sets such that at least two of the number of parameter sets can be collectively viewed using the single interface; and b. viewing means for collectively viewing at least two of the number of parameter sets.

2. A data processing system for optimizing a circuit design stored in a circuit design database, the circuit design database including a number of circuit modules wherein the optimization of selected ones of the number of circuit modules is selectively influenced by corresponding ones of a number of parameter sets, comprising:

a. storing means for storing the number of parameter sets such that a particular parameter set that corresponds to a particular circuit module can be uniquely identified by a search capability of the data processing system;

b. selecting means for selecting a particular one of the number of circuit modules for optimization;

c. searching means coupled to said storing means and further coupled to said selecting means for searching through the number of parameter sets and identifying the particular parameter set that corresponds to the selected one of the number of circuit modules; and d. optimizing means coupled to said selecting means and further coupled to said searching means for optimizing the selected one of the number of circuit modules using the corresponding parameter set.

3. A data processing system as in claim 2, and further comprising interface means for viewing selected ones of the number of parameter sets.

4. A data processing system according to claim 3, wherein said interface means further includes editing means for editing selected ones of the number of parameter sets.

5. A data processing system according to claim 3, wherein said interface means includes a spreadsheet program for viewing and editing said parameter sets.

6. A data processing system according to claim 3, wherein said interface means includes a menu for viewing and editing said parameter sets.

7. A data processing system according to claim 3, wherein said interface means is coupled to said storing means, for directly providing selected ones of the number of parameter sets to said storing means.

8. A data processing system according to claim 3, and further including translation means coupled intermediate said storing means and said interface means, a for providing selected ones of the number of parameter sets to said storing means via said translation means.

9. A data processing system according to claim 2, and further comprising quick check means for determining if each of the selected ones of the number of circuit modules have a corresponding parameter set.

10. A data processing system for optimizing a circuit design stored in a circuit design database, the circuit design database including a number of circuit modules wherein the optimization of selected ones of the number of circuit modules is selectively influenced by corresponding ones of a number of parameter sets, comprising:

a. storing means for storing selected ones of the number of parameter sets;

b. selecting means for selecting a particular one of the number of circuit modules for optimization;

c. searching means coupled to said storing means and further coupled to said selecting means for searching through the number of parameter sets and identifying the particular parameter set that corresponds to the selected one of the number of circuit modules; and d. optimizing means coupled to said selecting means and further coupled to said searching means for optimizing the selected one of the number of circuit modules using the corresponding parameter set.

11. A data processing system according to claim 10, wherein said storing means stores said number of parameter sets in a text file.

12. A data processing system according to claim 11, wherein said searching means includes a text editor having a search capability.

13. A data processing system according to claim 11, further comprising a quick check means for determining if each of the selected ones of the number of circuit modules have a corresponding parameter set stored in the text file.

14. A data processing system according to claim 10, and further comprising an interface means for collectively viewing the number of parameter sets.

15. A data processing system according to claim 14, wherein said interface means further includes an editing means for editing selected ones of the number of parameter sets.

16. A data processing system according to claim 14, wherein said interface means includes a spreadsheet means for viewing and editing said parameter sets.

17. A data processing system according to claim 14, wherein said interface means includes a menu means for viewing and editing said parameter sets.

18. A data processing system according to claim 14, wherein said interface means is coupled to said storing means, for directly providing selected ones of the number of parameter sets to storing means.

19. A data processing system according to claim 14 wherein a translation means couples said interface means to said storing means, wherein said interface means provides selected ones of the number of parameter sets to said storing means via said translation means.

20. A method for providing a number of parameter sets to an optimization program on a computer, wherein the optimization program optimizes a circuit design stored in a circuit design database, the circuit design database including a number of circuit modules wherein the optimization of selected ones of the number of circuit modules is selectively influenced by corresponding ones of the number of parameter sets, the method comprising the steps of:

a. defining the number of parameter sets;
 b. selecting a particular one of the number of circuit modules for optimization;
 c. searching through the number of parameter sets and identifying the particular parameter set that corresponds to the selected one of the number of circuit modules; and
 d. optimizing the selected one of the number of circuit modules using the corresponding parameter set.

21. A method according to claim 20, further comprising the steps of:

a. identifying whether predetermined ones of the number of circuit modules have a corresponding parameter set; and
 b. aborting if any of the predetermined ones of the number of circuit modules do not have a corresponding parameter set.

22. A method for providing a number of parameter sets to an optimization program wherein the optimization program optimizes a circuit design stored in a circuit design database, the circuit design database including a number of circuit modules wherein the optimization of selected ones of the number circuit modules is selectively influenced by corresponding ones of the number of parameter sets, comprising the steps of:

a. storing selected ones of the number of parameter sets in a text file;
 b. selecting a particular one of the number of circuit modules for optimization;
 c. searching through said text file and identifying the particular parameter set that corresponds to the selected one of the number of circuit modules; and
 d. optimizing the selected one of the number of circuit modules using the corresponding parameter set.

23. A method according to claim 22, wherein said searching step is performed by a text editor having a search capability.

24. A method according to claim 23, wherein said text editor is the AWK text parser.

25. A method operable on a computer for providing a number of parameter sets to an optimization program wherein the optimization program optimizes a circuit design stored in a circuit design database, the circuit design database including a number of circuit modules wherein the optimization of selected ones of the number circuit modules is selectively influenced by corresponding ones of the number of parameter sets, the optimization program processing selected ones of the number of circuit modules in a sequential order, the method comprising the steps of:

a. storing the number of parameter sets;
 b. arranging the number of parameter sets sequentially to correspond to the sequential order that the optimization program processes the selected ones of the number of circuit modules;
 c. selecting a first one of the number of selected circuit modules for optimization in accordance with the sequential order;
 d. selecting the corresponding first one of the number of parameter sets; and
 e. optimizing the first one of the number of circuit modules using said corresponding first one of the parameter sets.

26. A method according to claim 25, wherein steps (c)–(e) are repeated until all of the selected ones of the number of circuit modules have been processed by the optimization program.

27. A method operable on a computer for checking that a parameter set exists for each of selected ones of a number of circuit modules before executing an optimization program, wherein the optimization program is utilized to optimizes the selected ones of the number of circuit modules, the optimization of each of the selected ones of the number circuit modules being selectively influenced by a corresponding parameter set, the method comprising the steps of:

a. identifying whether a parameter set exists for each of the selected ones of the number of circuit modules; and
 b. permitting the optimization program to optimize the selected ones of the number of circuit modules if the identifying step identifies a corresponding parameter set for each of the selected ones of the number of circuit modules.

28. A method according to claim 27, wherein said identifying step (a) comprises the steps of:

a. choosing one of the selected ones of the number of circuit modules; and
 b. searching the number of parameter sets for a parameter set that corresponds to the chosen one of the selected ones of the number of circuit modules.

* * * * *